(12) United States Patent
Knopik (10) Patent No.: US 9,225,297 B2
(45) Date of Patent: Dec. 29, 2015

(54) PROTECTION MODULE FOR RF-AMPLIFIER

(71) Applicant: ST-Ericsson SA, Plan-les-Ouates (CH)

(72) Inventor: Vincent Knopik, St. Pierre d'Allevard (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/375,164

(22) PCT Filed: Feb. 19, 2013

(86) PCT No.: PCT/EP2013/053266
§ 371 (c)(1),
(2) Date: Jul. 29, 2014

(87) PCT Pub. No.: WO2013/127663
PCT Pub. Date: Sep. 6, 2013

(65) Prior Publication Data
US 2014/0368280 A1   Dec. 18, 2014

Related U.S. Application Data

(60) Provisional application No. 61/615,443, filed on Mar. 26, 2012.

(30) Foreign Application Priority Data

Feb. 28, 2012   (EP) .................................... 12305234

(51) Int. Cl.
*H03F 1/52* (2006.01)
*H03F 3/191* (2006.01)
(Continued)

(52) U.S. Cl.
CPC .. *H03F 1/52* (2013.01); *H03F 3/19* (2013.01);
*H03F 3/191* (2013.01); *H03F 3/245* (2013.01);
*H03F 2200/21* (2013.01); *H03F 2200/444*
(2013.01); *H03F 2200/468* (2013.01); *H03F 2200/471* (2013.01)

(58) Field of Classification Search
CPC ..................................... H03F 1/52; H03F 3/16
USPC ........................................ 330/298, 207 P, 277
See application file for complete search history.

(56) References Cited

U.S. PATENT DOCUMENTS 3,641,451 A   2/1972   Hollingsworth et al.
3,852,669 A   12/1974   Bowman et al.
(Continued)

OTHER PUBLICATIONS

International Search Report issued in corresponding International application No. PCT/EP2013/053266, date of mailing Apr. 22, 2013.
(Continued)

*Primary Examiner* — Henry Choe
(74) *Attorney, Agent, or Firm* — Patent Portfolio Builders PLLC (57) ABSTRACT

A protection module (4) for a RF-amplifier (2) is efficient against overvoltage due to load impedance mismatch when said RF-amplifier is connected to a load RF-element (3). The protection module comprises a branch with at least one diode-like operating component (D1, D2, ..., Dn) and a resistor (R2) which starts conducting when a RF-signal on a transmission link (6) between the RF-amplifier and the load RF-element is higher than a threshold set by the diode-like operating component. Such protection may be implemented in MOS technology only.

16 Claims, 6 Drawing Sheets (51) Int. Cl.
*H03F 3/24* (2006.01)
*H03F 3/19* (2006.01)

(56) References Cited

U.S. PATENT DOCUMENTS

| | | | |
|---|---|---|---|
| 4,122,400 A | 10/1978 | Medendorp et al. | |
| 4,673,886 A | 6/1987 | Bickley et al. | |
| 6,900,698 B2 * | 5/2005 | Ikeda | H03F 1/52 |
| | | | 330/110 |
| 7,348,854 B1 * | 3/2008 | Mordkovich | H03F 1/301 |
| | | | 330/285 |
| 7,482,878 B2 * | 1/2009 | Nakai | H03F 1/52 |
| | | | 330/298 |
| 7,692,491 B2 * | 4/2010 | Makihara | H03F 3/19 |
| | | | 330/207 P |
| 2003/0201835 A1 | 10/2003 | Dening et al. | |
| 2008/0218271 A1 * | 9/2008 | Mitzlaff | H04B 1/0466 |
| | | | 330/298 |

OTHER PUBLICATIONS

Written Opinion of the International Searching Authority issued in corresponding International application No. PCT/EP2013/053266, date of mailing Apr. 22, 2013.

* cited by examiner

PROTECTION MODULE FOR RF-AMPLIFIER

The invention relates to a protection module for protecting a RF-amplifier against overvoltage due to resistance mismatch when the RF-amplifier is connected to a load RF-element.

BACKGROUND OF THE INVENTION

It is well-known that a mismatch between the output resistance value of a RF-amplifier and the input resistance value of a load RF-element which is signal-fed by the RF-amplifier produces voltage overshooting. This voltage overshooting occurs at the transmission link or connection between the RF-amplifier and the load RF-element, and can damage the RF-amplifier or cause accelerated aging of this latter. The voltage standing wave ratio, or VSWR, is commonly used for quantifying the voltage overshooting.

Then, sensing and detection circuits have been used for detecting the voltage on the transmission link or connection between the RF-amplifier and the load RF-element, and for adapting parameters of the RF-amplifier or of an intermediate attenuator in order to limit the VSWR value. But such solutions have several drawbacks. First, the sensing circuit causes insertion loss, which results in additional power consumption by the RF-amplifier. Second, it is necessary to sense both the forward and the reverse power transmitted between the RF-amplifier and the load RF-element in order to avoid driving an overprotection which leads otherwise to non-optimized performances. Moreover, this needs to compute the detected signal to make a decision, which is time-consuming. In addition, the control is conducted on parameters effective at the input of the RF-amplifier, such as biasing, input RF-signal, power-amplifier sizing, gain sizing, etc, which also influences other blocks such as drivers, mixers, etc, and this may not be desired.

Another issue is that such RF-amplifier protection does not implement only MOS technology, thus leading to cost increase.

Figure 1:
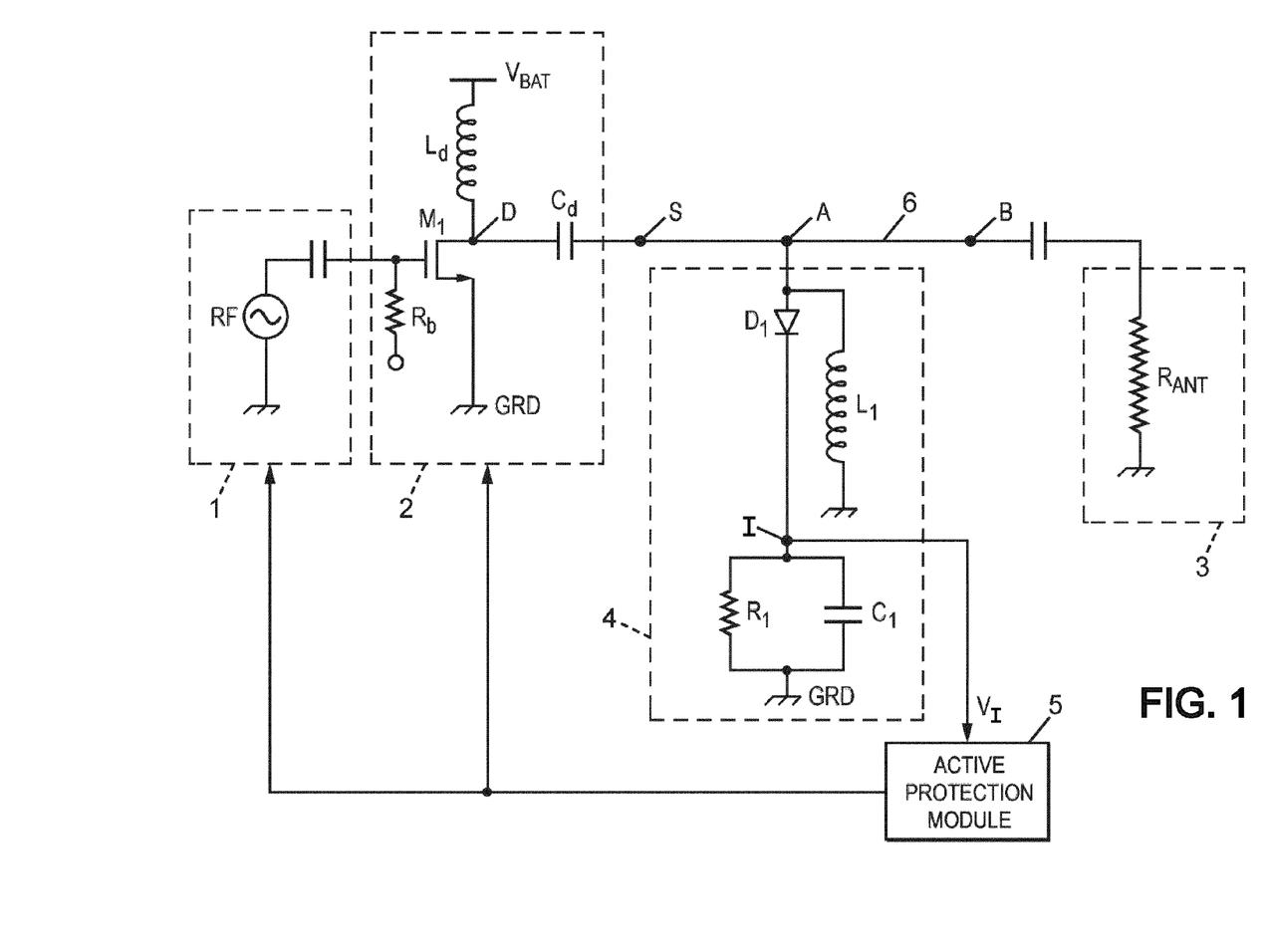
FIG. 1 is a circuit diagram of a transmission chain known before the present invention.

FIG. 1 is a circuit diagram of a known transmission chain including a RF-amplifier and another protection implementation against voltage overshooting. The reference numbers indicated therein are the following ones:
1: a source module which comprises a RF-generator
2: the RF-amplifier which is connected for amplifying a RF-signal produced by the source module
3: the load RF-element, for example a transmission antenna
4: an envelope detection module
5: an active protection module
6: the transmission link for the RF-signal from the RF-amplifier to the load RF-element Other references have the meanings now recited:
$V_{BAT}$: voltage of a power supply of the RF-amplifier 2
$M_1$: power transistor of the RF-amplifier 2
$R_b$: biasing resistor of the power transistor $M_1$
D: drain terminal of the power transistor $M_1$
GRD: reference terminal of the RF-amplifier 2
$L_d$, $C_d$: inductor and capacitor implemented for adjusting the output resistance value of the RF-amplifier 2
S output terminal of the RF-amplifier 2
A: input terminal of the envelope detection module 4
I: intermediate node of the envelope detection module 4
$R_1$, $C_1$: resistance and capacitor of the envelope detection module 4
$D_1$: diode of the envelope detection module 4
$L_1$: inductor of the envelope detection module 4
B input terminal of the load RF-element 3

The input terminal A of the envelope detection module 4 is connected to a node belonging to the transmission link 6.

Usually, the inductor $L_d$ and the capacitor $C_d$ are selected so that the output resistance value of the RF-amplifier 2 substantially matches the input resistance value of the load RF-element 3 for intermediate voltage values of the RF-signal. But this matching no longer applies when the voltage of the RF-signal becomes important, because the output resistance value of the RF-amplifier 2 decreases for high RF-voltage values. For example, intermediate RF-voltage values denote RF-voltage values which are less than 1.2 the supply voltage value $V_{BAT}$, and high RF-voltage values denote RF-voltage values higher than this limit.

The RF-frequency of the RF-signal which is produced by the source module 1 may be 2.5 GHz (gigahertz). The respective values of the resistance $R_1$ and capacitor $C_1$ may be respectively 10 kΩ (kilo-ohm) and 10 pF (picofarad) for instance. The value of the inductor $L_1$ may be 10 or 15 nH (nanohenry). If the supply voltage $V_{BAT}$ of the RF-amplifier 2 is positive with respect to the reference terminal GRD, then the input terminal A of the envelope detection module 4 is connected to the anode of the diode $D_1$, and the cathode of the diode $D_1$ is connected to the intermediate node I. If the supply voltage $V_{BAT}$ is negative with respect to the reference terminal GRD, then the input terminal A is connected to the cathode of the diode $D_1$, and the anode of this latter is connected to the intermediate node I.

The operation of the envelope detection module 4 is well known: the parallel-connected resistance $R_1$ and capacitor $C_1$ act as an averaging circuit which can be fed by the diode $D_1$ at each positive swing of the RF-voltage existing at the input terminal A. The inductor $L_1$ is connected between the input terminal A of the envelope detection module 4 and the reference terminal GRD of the RF-amplifier 2. It sets the diode $D_1$ in blocked state for the direct voltage component (DC-voltage), but it is not effective to the RF-signal. Thus, the voltage at the intermediate node I is an averaging of the maximum swing values of the RF-signal.

The active protection module 5 is fed at input with a signal produced from the envelope detection module 4, and acts on parameters of the source module 1 and/or the RF-amplifier 2 when the envelope reaches high values. The signal fed into the active protection module 5 may be directly the voltage $V_I$ at the intermediate node I, corresponding to the average value of the voltage magnitude of the RF-signal which exists on the transmission link 6. But such protection implementation requires using the active protection module 5, and thus has some of the drawbacks listed before.

Therefore, an object of the present invention is to provide an efficient protection for a RF-amplifier against voltage overshooting, which does not have these drawbacks. In particular, the present invention aims at protecting the RF-amplifier without requiring that its output voltage is monitored continuously.

Another object of the invention is to provide a protection which is efficient when the output RF-voltage becomes important and makes the output resistance value of the RF-amplifier to decrease appropriately.

Still another object of the invention is to provide a protection which is simple to implement and low cost.

Still another object of the present invention is to provide a protection which may be easily adapted to varying operation conditions of the RF-amplifier, in particular when a power supply voltage of the RF-amplifier varies or is changed voluntarily.

Still another object of the present invention is to provide a protection which may be easily adapted to actual toughness and parameters of the RF-amplifier, in particular the power transistor of this latter.

SUMMARY OF THE INVENTION

For meeting these objects and others, the invention proposes a protection module for protecting a RF-amplifier against overvoltage due to load impedance mismatch when the RF-amplifier is connected to a load RF-element, the protection module having an input terminal which is intended to be connected to a node belonging to a transmission link from the RF-amplifier to the load RF-element, and the protection module also having a reference terminal which is intended to be connected to a reference terminal of the RF-amplifier. The protection module comprises:

a branch which connects the input terminal of the protection module to an intermediate node, this branch comprising at least one diode-like operating component;
  a first resistance and a first capacitor which are connected in parallel to one another between the intermediate node and the reference terminal of the protection module; and
  an inductor with a first terminal of this inductor connected to the input terminal of the protection module.

According to the invention, the branch further comprises a second resistance which is connected in series with respect to the at least one diode-like operating component between the input terminal and the intermediate node of the protection module, and a second terminal of the inductor is connected to the intermediate node.

Thus, when the protection module of the invention is connected to the transmission link from the RF-amplifier to the load RF-element, the DC-voltage value on the transmission link is set at the same value as the intermediate node by the inductor. Then, upon a voltage swing of the RF-signal in the transmission link, the second resistance starts conducting only when the voltage on the transmission link becomes higher than an average voltage value with an excess amount which is higher than a threshold set by the diode-like operating component. Thus, the protection module is not effective as long as the voltage on the transmission link remains below the average value plus the threshold amount. But when the voltage on the transmission link becomes higher than this limit, the second resistance is effective as a load for the RF-amplifier, and its value can be adapted to the output resistance value of the RF-amplifier which is effective for the high output RF-voltage. Resistance matching is thus recovered, and protection against voltage overshooting is efficient for the RF-amplifier. Such protection is automatic and autonomous, without requiring additional active module.

The second resistance is thus effective for the RF-signal thanks to the connection of the second terminal of the inductor of the protection module to the intermediate node. Indeed, such connection of the inductor forms an additional branch within the protection module between its input terminal and the intermediate node, in addition to the branch containing the at least one diode-like operating component and the second resistance. Thanks to these two parallel-arranged branches, the inductor forms a return path for the RF-current which flows through the second resistance.

The second resistance value may be selected to be less than the output resistance value of the RF-amplifier which is effective for intermediate RF-signal. It is thus specifically adapted for the condition of important magnitude of the RF-signal to be amplified and transmitted.

Another advantage of the protection module of the invention is that it may be implemented only in MOS technology, i.e. it may be of integrated MOS-circuit type, thereby achieving low cost.

In addition, detection of the current through the second resistance can provide VSWR monitoring, in particular for operation diagnosis.

Improvements of the invention protection module may contain the following additional features, separately or in combination with one another:

the branch of the protection module may comprise several diode-like operating components which are connected in series between the input terminal of the protection module and the intermediate node, all the diode-like operating components being oriented with a common current flowing direction;
  a number of active ones among the diode-like operating components may be variable, and the protection module may further comprise a first controller arranged for controlling this number;
  each diode-like operating component may be a diode or a transistor connected so as to operate as a diode;
  the second resistance may be of a variable resistance type, and the protection module may further comprise a second controller arranged for controlling a value of this second resistance; and
  the protection module may further comprise a VSWR sensing module arranged for sensing a value of the current through the second resistance. If it is provided with both the second controller and the VSWR sensing module, this latter may be further arranged for providing the second controller with a control signal, so that the second controller controls the value of the second resistance based on the current sensed through the second resistance.

The invention also proposes an electronic device which comprises:

a source module, which is adapted for producing a RF-signal;
  a RF-amplifier, which is connected to the source module for amplifying the RF-signal;
  a load RF-element;
  a RF-signal transmission link, which connects an input terminal of the load RF-element to an output terminal of the RF-amplifier; and
  a protection module as described above, with the input terminal and the reference terminal of this protection module which are connected respectively to a node belonging to the transmission link and to a reference terminal of the RF-amplifier.

Improvements of the electronic device of the invention may contain the following additional features, separately or in combination with one another:

the second resistance of the protection module may be between 0.1 and 2 times an output resistance value of the RF-amplifier, this output resistance value being effective for a RF-voltage magnitude at the output of the RF-amplifier which is higher than 1.2 times a supply voltage value of the RF-amplifier;
  the protection module and the RF-amplifier may have one common integrated MOS circuit substrate;
  the electronic device may further comprise a supply sensing module for sensing a supply voltage value of the RF-amplifier. Then, when the protection module has a variable number of diode-like operating components and/or a variable second resistance, the supply sensing module may be connected to the first and/or second controller so as to control the number of active diode-like operating components and/or the value of the second resistance, respectively, as a function of the supply voltage value of the RF-amplifier;

the electronic device may further comprise a monitoring module connected at input to the intermediate node of the protection module;

the load RF-element may comprise an antenna; and the electronic device may be adapted for forming part of a RF-transmission chain of a mobile communication equipment. In particular, this mobile communication equipment may be a mobile user terminal.

Preferred but non-limiting embodiments of the invention are now described in detail with reference to the figures now listed.

DETAILED DESCRIPTION OF THE INVENTION

FIG. 1 has already been described and relates to a protection implementation known before the present invention.

Figure 2:
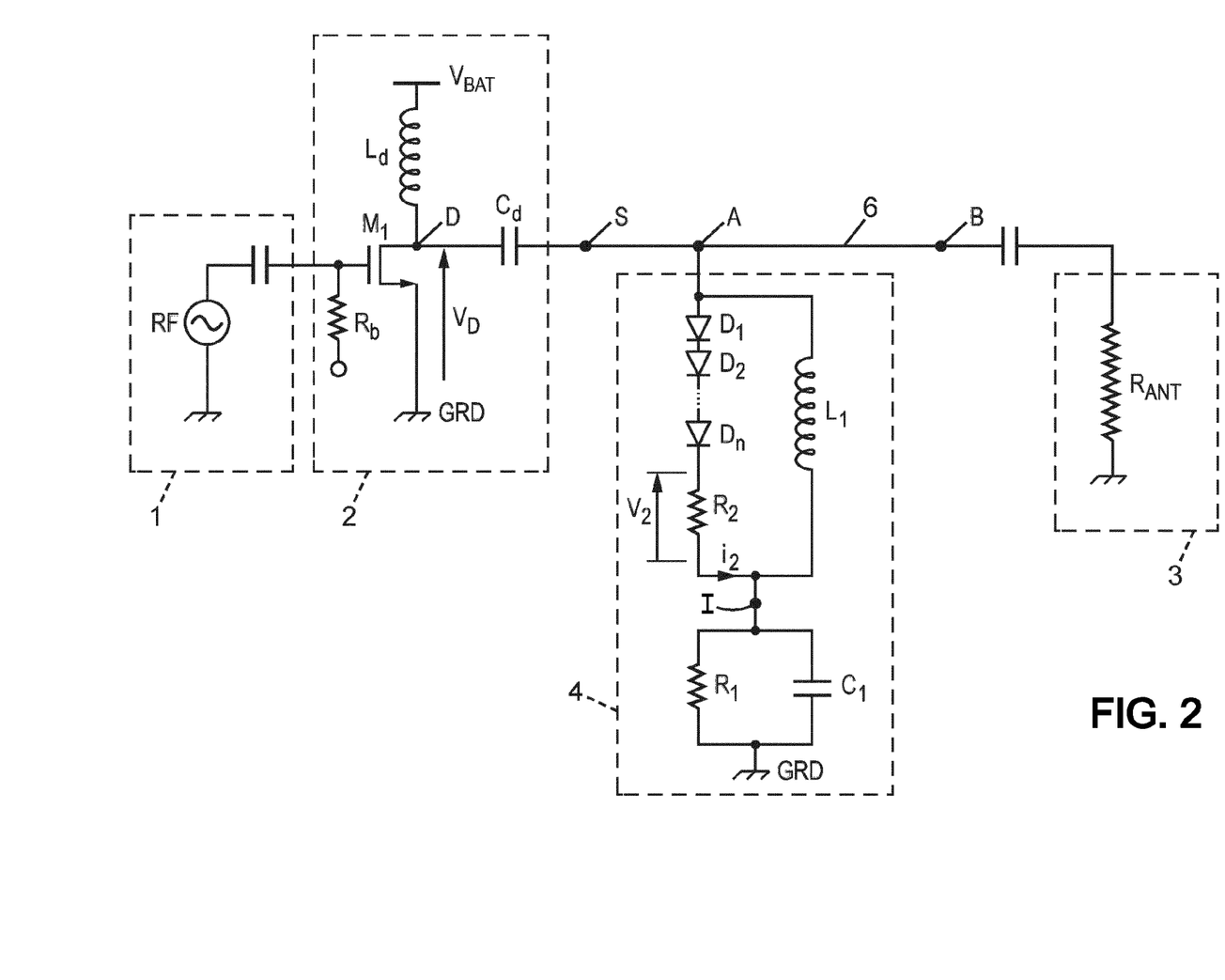
FIG. 2 is a circuit diagram of an electronic device according to the present invention.

A particular embodiment of the invention is now described with reference to FIG. 2. FIG. 2 appears as a modification of the circuit diagram of FIG. 1. Therefore, common elements are not repeated, and description is only focused on the novel features pertaining to the invention. In particular, same references and reference numbers which are displayed in these figures have identical meanings.

For illustrative purpose, the electronic device considered may be part of a transmission chain of a mobile communication equipment such as a mobile user terminal. Then, the load RF-element 3 may be a RF-antenna. Then, its impedance is mainly of resistance type and denoted $R_{ANT}$. The inductor $L_d$ and the capacitor $C_d$ may be selected preferably so that the output resistance value of the RF-amplifier 2 matches substantially the antenna resistance $R_{ANT}$. The RF-amplifier 2 may be of AB-class, and the resistance matching may be verified for a RF-signal transmitted from the RF-amplifier 2 to the load RF-element 3 with magnitude less than the supply voltage value $V_{BAT}$. When this RF-signal magnitude becomes higher than the supply voltage value $V_{BAT}$, the output resistance value of the RF-amplifier 2 usually diminishes. Then, the resistance value of the load RF-element 3 becomes mismatched with the output resistance of the RF-amplifier 2 for the swings of the amplified RF-signal, and a reverse signal is reflected back from the load RF-element 3 towards the RF-amplifier 2. This results in a high VSWR value which may damage the RF-amplifier 2, more specifically its power amplification stage, or accelerate aging of the same.

The diode $D_1$ is replaced with a set of diodes $D_1, D_2, \ldots, D_n$ which are connected in series with a common current flowing direction, from the input terminal A of the module 4 towards the intermediate node I. If the supply voltage $V_{BAT}$ of the RF-amplifier 2 is positive with respect to the reference terminal GRD, this common current flowing direction is from the input terminal A of the module 4 towards the intermediate node I. Conversely, it is from the intermediate node I towards the input terminal A if the supply voltage $V_{BAT}$ is negative. The number of diodes used sets the minimum limit for VSWR detection.

Possibly, this diode set may only contain one diode, and each diode may be replaced with a transistor connected so as to have a diode-like electrical behaviour.

A resistance $R_2$ is added within the branch of the module 4 between the input terminal A and the intermediate node I, in series with the diode set $D_1, D_2, \ldots D_n$. The value of the resistance $R_2$ may be preferably low, advantageously between 1Ω and 10Ω.

The inductor $L_1$ is now connected between the input terminal A of the module 4 and the reference terminal GRD, which is common to the module 4 and the RF-amplifier 2.

When the RF-frequency is still 2.5 GHz, then the numeral value of the the resistance $R_1$ may be 10 kΩ again, that of the capacitor $C_1$ may be 10 pF, and that of the inductor $L_1$ may be 10 or 15 nH again, for instance.

Connecting the second terminal of the inductor $L_1$ to the intermediate node I instead of the reference terminal GRD sets the direct voltage component of the transmission link 6—i.e. DC-voltage value at terminal A—to be substantially equal to that of the intermediate node I. It also allows a RF-current which flows through the diodes $D_1, D_2, \ldots, D_n$ to be evacuated from the intermediate node I. Put another way, the inductor $L_1$ bypasses the combination of the capacitor $C_1$ and the resistor $R_1$ for the RF-current, so that this RF-current only senses the resistance $R_2$ when the positive swing of the RF-signal in the transmission link 6 exceeds the voltage value at the intermediate node I added to the total threshold of the diode set $D_1, D_2, \ldots, D_n$. Thus, when the positive swing of the RF-signal reaches important values, the branch comprising the resistance $R_2$ starts conducting, so that the load impedance effective for the RF-amplifier 2 is then close to the value of the resistance $R_2$. This value of the resistance $R_2$ is then to be selected close to the output resistance value of the RF-amplifier 2, which is effective for such condition of high positive voltage of the RF-signal. Usually, this output resistance value of the RF-amplifier 2 for high positive voltage of the RF-signal is less than that for intermediate voltage of the RF-signal. Therefore, the load resistance value which is perceived by the RF-amplifier 2 changes from the resistance value $R_{ANT}$ of the antenna for intermediate RF-signal instant voltage values to the value of the resistance $R_2$ for high RF-signal instant voltage values.

In this way, the load resistance perceived by the RF-amplifier 2 is always adapted to the output feature of the RF-amplifier 2, so that voltage overshooting at the transmission link 6 between the RF-amplifier 2 and the load RF-element 3 is avoided. The resistance $R_2$ acts by its own as a protection to the RF-amplifier 2, so that the module 4 alone provides the protection of the RF-amplifier 2 without the further module 5 being necessary. For this reason, module 4 as modified by the present invention is called protection module itself.

Voltage $V_2$ is that existing between both terminals of the resistance $R_2$ as indicated on FIG. 2. This voltage reflects the VSWR value existing on the transmission link 6 between the RF-amplifier 2 and the load RF-element 3. Thus, monitoring the variations of the voltage $V_2$ provides knowledge of the occurrence of important VSWR values and helps for adjusting and optimizing the parameters of the invention protection module 4.

Figure 3:
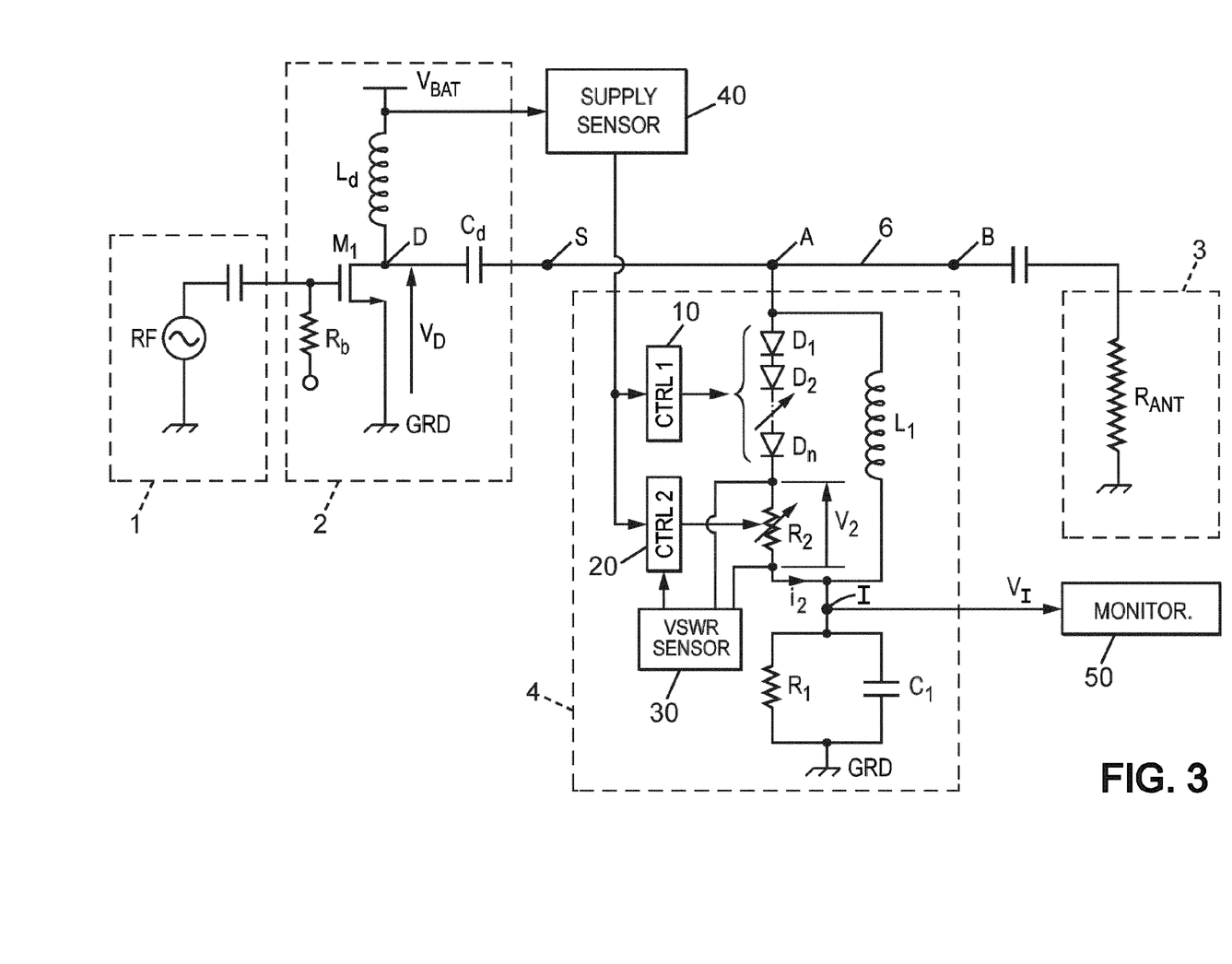
FIG. 3 is a circuit diagram showing several improvements of the electronic device of FIG. 2.

In particular, according to improvements of the invention illustrated in FIG. 3, the number of the diodes $D_1, D_2, \ldots, D_n$ which are active may be variable, and/or the value of the resistance $R_2$. Then, the protection module 4 may additionally comprise a first controller 10, denoted CTRL 1 on FIG. 3, for controlling the number of the active ones among the diodes $D_1, D_2, \ldots, D_n$, and/or a second controller 20, denoted CTRL 2, for controlling the value of the resistance $R_2$. Non-active diodes are individually equivalent to a short circuit. These diode number and resistance value may be set by an operator, but they are preferably set automatically using a VSWR sensor 30 and/or a supply voltage sensor 40.

The VSWR sensor 30 may be a voltage sensor connected to both terminals of the resistance $R_2$. It may be provided with one or several threshold filters for outputting a control signal when high VSWR-value occurs, which may damage the RF-amplifier 2. This control signal is transmitted to the second controller 20 for adjusting the value of the resistance $R_2$ as a function of the VSWR-value. Optionally, the VSWR sensor 30 may also supply the first controller 10 with another control signal for adjusting the diode number as a function of the VSWR-value simultaneously.

The supply voltage sensor 40 may be arranged for sensing the voltage value $V_{BAT}$ of the power supply unit which is used for powering the RF-amplifier 2. For example, this power supply unit may be a test supply unit with supply voltage $V_{BAT}$ of about 3.6 V (volt). Alternatively, the power supply unit may be a refillable battery which supplies the RF-amplifier 2 with a supply voltage $V_{BAT}$ decreasing upon operation from a maximum supply voltage of about 4.2 V, for example.

A high VSWR-value endangers less the RF-amplifier 2 when the supply voltage $V_{BAT}$ is reduced, as compared to operating conditions with maximum $V_{BAT}$ value. Then, the function of the invention protection module 4 to be effective for a high VSWR-value may be attenuated for reduced values of the supply voltage $V_{BAT}$, because such reduced $V_{BAT}$-values make that the RF-amplifier 2 remains safe despite a high VSWR-value. To this purpose, the supply voltage sensor 40 may supply the first controller 10 and the second controller 20 with appropriate control signals for increasing the number of active ones among the diodes $D_1, D_2, \ldots, D_n$ and/or increasing the value of the resistance $R_2$. Thus the protection module 4 becomes less efficient. The energy consumption within the protection module 4 and also the insertion loss which affects the RF-signal can be reduced in this way, when protection is less or not necessary.

Finally, a voltage monitoring module 50 may be connected to the intermediate node I for displaying or recording the voltage $V_I$ existing at the intermediate node I. This voltage $V_I$ is continuous or slowly-varying.

Figure 4A:
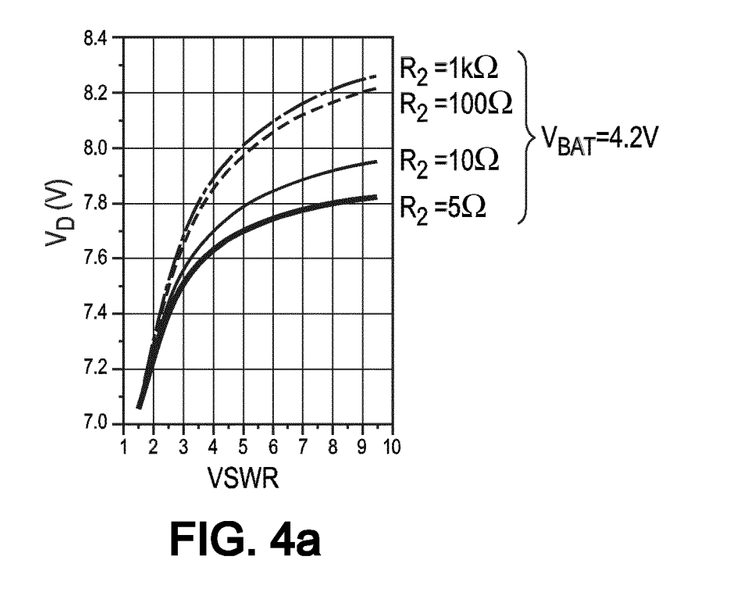
FIGS. 4a-4b, 5a-5c and 6 are charts illustrating the operation of a protection module according to the invention, within an electronic device corresponding to FIG. 2.

The diagram of FIG. 4a is a computer simulation for illustrating the protection efficiency as a function of the VSWR value. X-axis indicates the VSWR values, which are higher than unity, and Y axis indicates the maximum voltage values $V_D$ at the drain terminal D of the power transistor $M_1$, in volts (V). The value captioned for each curve is that used for the resistance $R_2$. The supply voltage $V_{BAT}$ is 4.2 V for this simulation, and the values of the other circuit elements are those already indicated. It is clear that the $R_2$-value of 5Ω produces the most important lowering of the $V_D$-value, and thus the best protection, whereas $R_2$=1 kΩ (kilo-ohm) leads to about no protection.

Figure 5A:
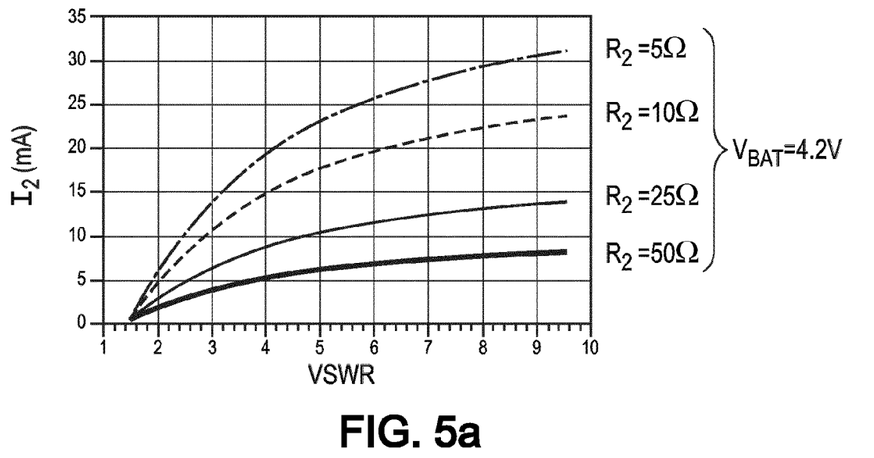

The diagram of FIG. 5a is a computation of the magnitude $I_2$ in milliamperes (mA) of the RF-current $i_2$ which flows in the resistance $R_2$, as a function of the VSWR value for $V_{BAT}$=4.2 V. This current is more important for lower values of the resistance $R_2$, showing again that the protection obtained is better for $R_2$=5Ω.

Figure 4B:
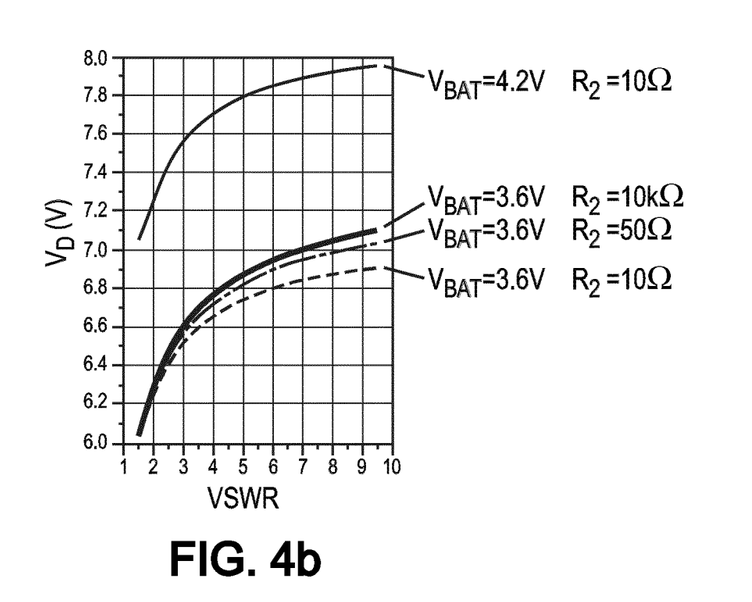
Figure 5B:
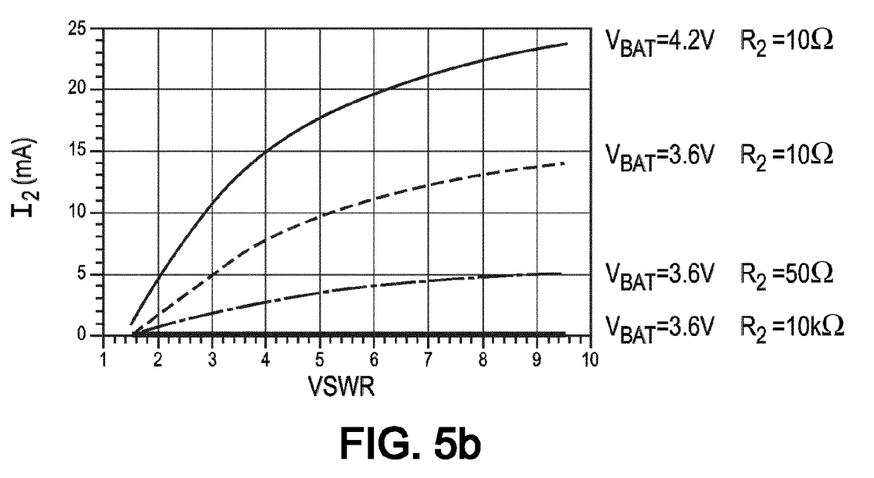

FIGS. 4b and 5b correspond respectively to FIGS. 4a and 4b, but for comparing the protection levels which are obtained with the values 3.6 V and 4.2 V for the supply voltage $V_{BAT}$.

The maximum voltage value $V_D$ at the drain terminal D is lower for $V_{BAT}$=3.6 V than for $V_{BAT}$=4.2 V, in such an extent that the $R_2$-value of 10 kΩ with $V_{BAT}$=3.6 V leads to damage exposure for the transistor $M_1$ which is less than the $R_2$-value of 10Ω with $V_{BAT}$=4.2 V (see FIG. 4b). Therefore, the current consumption in the invention protection module 4 can be avoided by increasing the $R_2$-value up to 10 kΩ when the supply voltage value $V_{BAT}$ is 3.6 V (see FIG. 5b), without incurring damage for the transistor $M_1$.

Figure 5C:
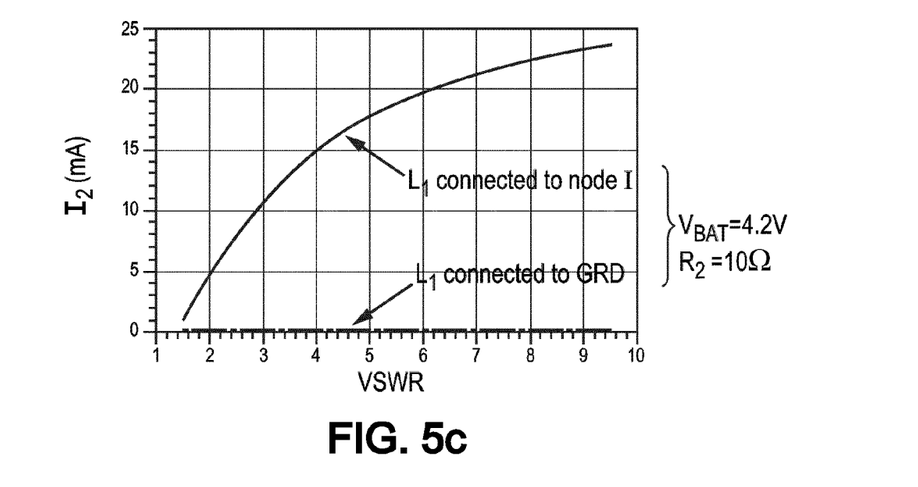

FIG. 5c corresponds to FIG. 5b with $V_{BAT}$=4.2 V and $R_2$=10Ω, but comparing the cases where the inductor $L_1$ is connected to both the input terminal A and the intermediate node I (curve denoted "$L_1$ connected to node I"), and where the inductor $L_1$ is connected to both the input terminal A and the reference terminal GRD (curve denoted "$L_1$ connected to GRD"). The RF-current $i_2$ is about zero in the latter case, showing that the connection of the inductor $L_1$ to the intermediate node I is necessary for obtaining the protection effect of the transistor $M_1$ by the resistance $R_2$.

Figure 6:
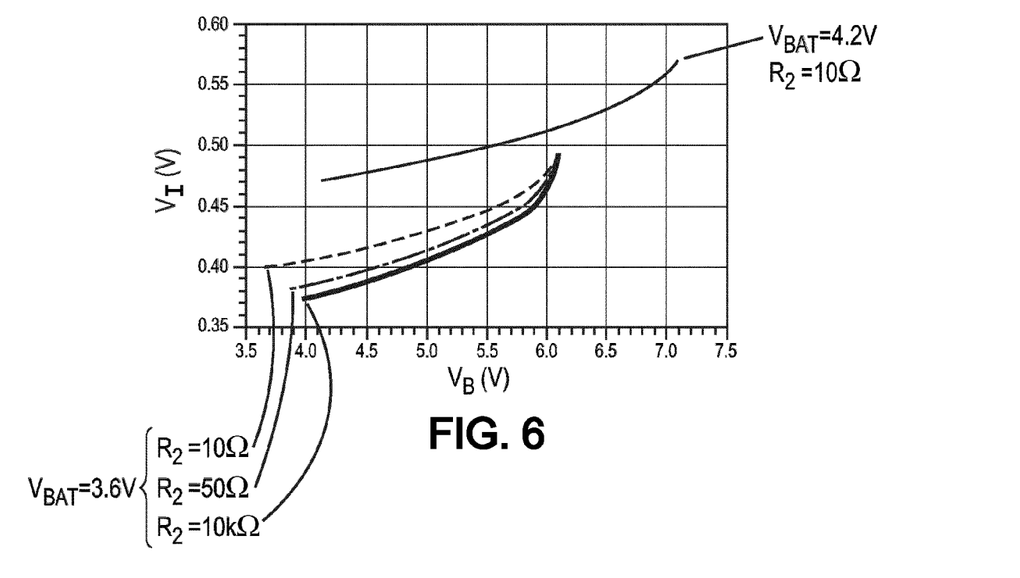

Finally, FIG. 6 shows variations of the voltage $V_I$ at the intermediate node I as a function of the magnitude of the RF-voltage $V_B$ which is supplied to the load RF-element 3. The respective $V_{BAT}$- and $R_2$-values for the four plots are identical to those of FIG. 5b. This diagram shows that the voltage sent to the monitoring module 50 (FIG. 3) actually reflects the variations of the voltage magnitude of the RF-signal in all cases. A monitoring of the RF-power transmitted to the load RF-element 3 is thus possible, even for high $R_2$-values (for example 10 kΩ) which do not provide protection of the power transistor $M_1$.

The Man skilled in the art will understand that the invention may be reproduced while modifying some aspects with respect to the detailed description just above, and maintaining some of its advantages. One may cite among these advantages:

- the protection module is autonomous and operates automatically when dangerous impedance appears to the RF-amplifier;
- the whole protection module may be implemented in MOS technology and requires small silicon substrate area;
- the protection circuit may be a standalone circuit;
- the protection circuit may be implemented whatever the RF-standard used;
- the protection circuit can provide resistance matching for high RF-signal voltage;
- the protection module may have variable or programmable parameters, in particular as a function of the supply voltage of the RF-amplifier and/or also as a function of the temperature;
- it is possible to incorporate a VSRW sensor in the protection module, and/or an output RF-signal magnitude monitor, in analog or digital form;
- it does not need using a specific coupler to the RF-transmission link, therefore causing very reduced or no insertion loss;
- protection function, VSWR sensing and output voltage monitoring are separated from one another, allowing protection without VSWR sensing or VSWR sensing without protection if desired, and any combination with or without output voltage monitoring;
- protection is provided without acting on the RF-amplifier itself or the RF-signal source, so that the transmission chain is not disturbed; and
- the whole electronic device may be implemented using a standard technology without requiring high performance transistor, thus avoiding special cost increase.

All numeral values have been provided only for illustrative purpose and may be adapted to each implementation. In particular, some or all the diodes $D_1, D_2, \ldots, D_n$ may be replaced by transistors connected for operating as diodes. Furthermore, if the supply voltage $V_{BAT}$ is negative, all the diodes $D_1$, $D_2, \ldots, D_n$ are to be reversed for consistency with such polarization conditions.

The invention claimed is:

1. A protection module for protecting a RF-amplifier against overvoltage due to load impedance mismatch when said RF-amplifier is connected to a load RF-element, said protection module having an input terminal able to connect to a node belonging to a RF-signal transmission link from the RF-amplifier to the load RF-element, and the protection module also having a reference terminal able to connect to a reference terminal of the RF-amplifier, said protection module comprising:
a branch connecting the input terminal of the protection module to an intermediate node, said branch comprising at least one diode-like operating component;
a first resistance and a first capacitor connected in parallel to one another between the intermediate node and the reference terminal of the protection module; and
an inductor with a first terminal of said inductor connected to the input terminal of the protection module, wherein:
the branch further comprises a second resistance connected in series with respect to the at least one diode-like operating component between the input terminal and the intermediate node of the protection module; and
a second terminal of the inductor is connected to the intermediate node.

2. A protection module according to claim 1, of integrated MOS-circuit type.

3. A protection module according to claim 1, wherein the branch comprises several diode-like operating components connected in series between the input terminal of the protection module and the intermediate node, all the diode-like operating components being oriented with a common current flowing direction.

4. A protection module according to claim 3, wherein a number of active ones among the diode-like operating components is variable, and the protection module further comprises a first controller arranged for controlling the number of active diode-like operating components.

5. A protection module according to claim 1, wherein each diode-like operating component is a diode or a transistor connected so as to operate as a diode.

6. A protection module according to claim 1, wherein the second resistance is of a variable resistance type, and the protection module further comprises a second controller arranged for controlling a value of the second resistance.

7. A protection module according to claim 1, further comprising a VSWR sensing module arranged for sensing a value of a current through the second resistance.

8. A protection module according to claim 6, wherein the VSWR sensing module is further arranged for providing the second controller with a control signal, so that said second controller controls the value of the second resistance based on the current sensed through the second resistance.

9. An electronic device comprising:
a source module adapted for producing a RF-signal;
a RF-amplifier connected to the source module for amplifying the RF-signal;
a load RF-element;
a RF-signal transmission link connecting an input terminal of the load RF-element to an output terminal of the RF-amplifier; and
a protection module according to claim 1, with the input terminal and the reference terminal of said protection module connected respectively to a node belonging to the transmission link and to a reference terminal of the RF-amplifier.

10. An electronic device according to claim 9, wherein the second resistance of the protection module is between 0.1 and 2 times an output resistance value of the RF-amplifier, said output resistance value being effective for a RF-voltage magnitude at the output of the RF-amplifier higher than 1.2 times a supply voltage value of said RF-amplifier.

11. An electronic device according to claim 9, wherein the protection module and the RF-amplifier have one common integrated MOS circuit substrate.

12. An electronic device according to claim 9, further comprising a supply sensing module for sensing a supply voltage value of the RF-amplifier,
and wherein the supply sensing module is connected to the first or second controller so as to control the number of active diode-like operating components or the value of the second resistance, respectively, as a function of the supply voltage value of the RF-amplifier.

13. An electronic device according to claim 8, further comprising a monitoring module connected at input to the intermediate node.

14. An electronic device according to claim 8, wherein the load RF-element comprises an antenna.

15. An electronic device according to claim 8, adapted for forming part of a RF-transmission chain of a mobile communication equipment.

16. An electronic device according to claim 15, wherein the mobile communication equipment is a mobile user terminal.

* * * * *